US011764024B2

United States Patent
Wang et al.

(10) Patent No.: US 11,764,024 B2
(45) Date of Patent: Sep. 19, 2023

(54) HOLDER FOR SNAP-FITTING A THERMAL FUSE TO AN ELECTRONIC COMPONENT

(71) Applicant: SIGNIFY HOLDING B.V., Eindhoven (NL)

(72) Inventors: Zhipei Wang, Shanghai (CN); Johannes Maria Van Meurs, Veghel (NL); Mark Johannes Antonius Verhoeven, Deurne (NL); Huan Zhang, Shanghai (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 194 days.

(21) Appl. No.: 17/437,149

(22) PCT Filed: Mar. 10, 2020

(86) PCT No.: PCT/EP2020/056323
§ 371 (c)(1),
(2) Date: Sep. 8, 2021

(87) PCT Pub. No.: WO2020/182800
PCT Pub. Date: Sep. 17, 2020

(65) Prior Publication Data
US 2022/0148838 A1 May 12, 2022

(30) Foreign Application Priority Data

Mar. 12, 2019 (WO) ................ PCT/CN2019/077885
Jun. 6, 2019 (EP) ..................................... 19178816

(51) Int. Cl.
*H01H 85/20* (2006.01)
*H01H 85/165* (2006.01)
(Continued)

(52) U.S. Cl.
CPC ........ *H01H 85/20* (2013.01); *H01H 85/0241* (2013.01); *H01H 85/143* (2013.01); *H01H 85/165* (2013.01); *H01H 2085/0275* (2013.01)

(58) Field of Classification Search
CPC .. H01H 85/20; H01H 85/0241; H01H 85/143; H01H 85/165; H01H 2085/0275; H01H 2085/0412
See application file for complete search history.

(56) References Cited

U.S. PATENT DOCUMENTS 4,556,274 A 12/1985 Olivera
5,941,735 A 8/1999 Bernardini
(Continued)

FOREIGN PATENT DOCUMENTS

DE 19805785 C1 6/1999
DE 102008056145 A1 6/2009
(Continued)

OTHER PUBLICATIONS

JPS5661073, May 23, 1981, Entire Document (Translation of JPS5661073). (Year: 1981).*

*Primary Examiner* — Stephen S Sul

(57) ABSTRACT

The invention provides a holder for snap-fitting a thermal fuse to an electronic component, wherein the holder comprises: a bottom surface for mounting the holder to a carrier comprising the electronic component, wherein the bottom surface comprises an opening for accommodating the electronic component; a first wall parallel to a second wall, wherein the first wall and the second wall each comprise a protrusion for snap-fitting the thermal fuse to the electronic component; a third wall, wherein the third wall comprises an edge for bending around at least one lead of the thermal fuse, wherein a shortest distance between the bottom surface and
(Continued)

said edge is larger than a shortest distance between the bottom surface and one of said protrusion.

14 Claims, 3 Drawing Sheets

(51) Int. Cl.
*H01H 85/143* (2006.01)
*H01H 85/02* (2006.01)

(56) References Cited

U.S. PATENT DOCUMENTS

| | | | | |
|---|---|---|---|---|
| 6,031,446 A | * | 2/2000 | Prohaska | H01H 9/10 337/214 |
| 2003/0049955 A1 | * | 3/2003 | Schilling | H01R 12/718 439/83 |
| 2006/0197647 A1 | * | 9/2006 | Whitney | H05K 3/301 337/297 |
| 2017/0276115 A1 | | 9/2017 | Vogelbacher et al. | |
| 2018/0283672 A1 | * | 10/2018 | Lehman | H01R 12/55 |
| 2022/0139658 A1 | * | 5/2022 | Beyer | H01H 85/20 337/142 |

FOREIGN PATENT DOCUMENTS

| | | | |
|---|---|---|---|
| EP | 1282170 A1 | | 2/2003 |
| JP | S5661073 | * | 5/1981 |
| JP | S5661073 U | | 5/1981 |
| JP | H07336876 A | | 12/1995 |
| JP | 2000048977 A | | 2/2000 |
| JP | 2002334957 A | | 11/2002 |
| JP | 2009283360 A | | 12/2009 |
| JP | 2012104652 A | | 5/2012 |
| KR | 20070000770 A | | 1/2007 |
| WO | 2003024164 A2 | | 3/2003 |

* cited by examiner

HOLDER FOR SNAP-FITTING A THERMAL FUSE TO AN ELECTRONIC COMPONENT

CROSS-REFERENCE TO PRIOR APPLICATIONS

This application is the U.S. National Phase application under 35 U.S.C. § 371 of International Application No. PCT/EP2020/056323, filed on Mar. 10, 2020, which claims the benefits of European Patent Application No. 19178816.5, filed on Jun. 6, 2019 and Chinese Patent Application No. PCT/CN2019/077885, filed on Mar. 12, 2019. These applications are hereby incorporated by reference herein.

FIELD OF THE INVENTION

The invention relates to a holder for snap-fitting a thermal fuse to an electronic component. The invention further relates to an assembly for snap-fitting a thermal fuse to an electronic component, the assembly comprising said holder, the thermal fuse, and a carrier comprising said electronic component. The invention further relates to a carrier comprising said holder, and a lighting device comprising said holder. The invention further relates to the use of said holder to snap-fit a thermal fuse to an electronic component. The invention further relates to a method of snap-fitting a thermal fuse to an electronic component with said holder.

BACKGROUND OF THE INVENTION

Thermal fuses are widely known for protection of electronic circuits. A thermal fuse may be mounted to an electronic component to monitor its temperature. When the temperature of such an electronic component is beyond a threshold value, i.e. e.g. being in abnormal operation conditions, the thermal fuse will trigger and consequently fuse off the electronic circuit.

Generally, a thermal fuse is glued to the electronic component with thermal glue. However, gluing a thermal fuse to the electronic component often requires a long lead time in manufacturing and higher resulting costs: because the thermal glue quantity is difficult to control; because more elaborate tooling is required to press the fuse to the electronic component and keep the fuse position accordingly during the curing process of the thermal glue; and because fast curing thermal glue may often not be suitable, e.g. for application to sensitive PCB's, due to its corrosive impact, thus using regular thermal glue may take longer to cure.

An alternative to thermal glue is double sided tape. However, due to the relatively small electronic components and/or limited adhering properties of double-sided tape, it is difficult to establish a reliable connection between the electronic component and the thermal fuse with double sided tape.

Hence, a clear need exists to find an improved solution to mount a thermal fuse to an electronic component.

SUMMARY OF THE INVENTION

It is an object of the invention to provide an improved holder for snap-fitting a thermal fuse to an electronic component, which at least alleviates the problems and disadvantages mentioned above. Thereto, the invention provides a holder for snap-fitting a thermal fuse to an electronic component, wherein the holder comprises: a bottom surface for mounting the holder to a carrier comprising the electronic component, wherein the bottom surface comprises an opening for accommodating the electronic component; a first wall parallel to a second wall, wherein the first wall and the second wall each comprise a protrusion for snap-fitting the thermal fuse to the electronic component; a third wall, wherein the third wall comprises an edge for bending around at least one lead of the thermal fuse, wherein a shortest distance between the bottom surface and said edge is larger than a shortest distance between the bottom surface and one of said protrusion.

Hence, the invention provides a holder for snap-fitting the thermal fuse to an electronic component. Namely: The bottom surface of the holder comprises an opening for accommodating the electronic component, whereas the protrusion of the first wall and the protrusion of the second wall enable snap-fitting the thermal fuse to the electronic component. Moreover, in examples, the bottom surface may at least partly surround said opening. As a consequence, the holder advantageously enables the electronic component to be in a position in which the electronic component may be mutually aligned with the thermal fuse which is snap-fitted into the holder and onto said electronic component. Hence, the electronic component may be received (or: positioned, or: accommodated, or: hosted) by the holder and/or by said opening of the holder. Hereby, the thermal fuse may abut the electronic component. The thermal fuse may therefore be mounted irreversibly to the electronic component (unless unmounting the whole holder from the component). Since no thermal glue is required to mount the thermal fuse to the electronic component according to the present invention, a more efficient manufacturing process is provided.

Furthermore, the thermal fuse comprises at least one lead (or alternatively phrased: at least one lead wire). For example, the thermal fuse may comprise a first lead (wire) and a second lead (wire). The leads may end in the fuse, i.e. e.g. the fuse head. It may be common (e.g. to a person skilled in the art) that the at least one lead of the thermal fuse may be soldered to the carrier. For example, said at least one lead may be soldered to a PCB so as to connect the thermal fuse to the circuitry of said PCB. Since the heat generated and transferred from such soldering may cause the thermal fuse to trigger falsely during said soldering, the at least one lead of the thermal fuse may be relatively long, such that the thermal fuse may be integrated into the electronic circuit without said false triggering.

Since the third wall of the holder comprises an edge for bending around the at least one lead of the thermal fuse, wherein a shortest distance between the bottom surface and said edge is larger than a shortest distance between the bottom surface and one of said protrusion (i.e. each one of said protrusion), the at least one lead of the thermal fuse may be compactly assembled with said holder. That is: the relatively long at least one lead of the thermal fuse may for example be bend in an upwards direction from the snap-fitted thermal fuse (i.e. the fuse head) along the third wall, around said edge of the third wall, and back in a downwards direction along the third wall. Due to said meandering of the at least one lead, the length of the at least one lead is effectively incorporated (or: processed) by the very design of the holder, such that less space (e.g. on the carrier) is required for mounting said thermal fuse onto the electronic component. Thus, the at least one lead of the thermal fuse may be soldered close to the location on the carrier where said electronic component and the thermal fuse mounted thereon are present, while said soldering (close by) does not render a false trigger. This is a clear advantage, and moreover a benefit provided by said holder.

In an embodiment, the first wall, the second wall and the third wall may be perpendicular to the bottom surface. In addition, or alternatively, in an embodiment, the first wall, the second wall and the third wall may be protruding from the bottom surface. In an embodiment, the third wall is transverse to the first wall and the second wall. In addition, or alternatively, in an embodiment, the third wall may be arranged to connect the first wall to the second wall. Such embodiments provide an improved design of the holder.

As mentioned, the edge of the third wall is arranged for bending around at least one lead of the thermal fuse. To facilitate said bending, said edge may comprise a recess, or e.g. an indentation. Hence, in an embodiment, the edge may comprise at least one recess for bending around, respectively, the at least one lead of the thermal fuse. For example, the edge may comprise a first recess to accommodate and bend a first lead (wire) of the thermal fuse, and may comprise a second recess to accommodate and bend a second lead (wire) of the thermal fuse.

Moreover, when bending at least one lead of the thermal fuse around said edge, it may be advantageous to keep each one of said at least one lead distant/separate/isolated from each other, so as to prevent e.g. short circuiting. Hence, in an embodiment, the third wall may comprise a ridge for isolating a first lead of the thermal fuse from a second lead of the thermal fuse. Said isolating may thus be phrased as keeping a tolerance, a distance, or separating. Such a ridge may alternatively be at least one ridge, for example, when more than two leads require separation. Thus, in examples, the third wall may comprise at least one ridge for isolating, respectively, the at least one lead of the thermal fuse.

Furthermore, in examples, said third wall may comprise at least one groove for accommodating, respectively, the at least one lead of the thermal fuse. Yet in alternative embodiments, said third wall may comprise at least one hole for accommodating, respectively, the at least one lead of the thermal fuse. This ensures that the at least one lead of the thermal fuse is completely surrounded by the material of the third wall and thereby fully isolated.

The holder may comprise a holder material. Said holder material may for example be a polymer, a metal or a ceramic. A polymer material may for example be more economical to manufacture. Hence, in an embodiment, the holder may comprise a polymer material. Such a polymer material may be one of known polymer materials in the field of electronics. Thus, in examples, the polymer material may be one of: PP, PC, PA, PBT, PE, ABS, PS, PVC, PF, HDPE, LDPE, or PTFE. Such materials may be well suited to manufacture the holder according to the invention. In an embodiment, the holder may be injected-molded, or 3D printed.

As partly mentioned, a thermal fuse may protect an electronic circuit comprising electronic components. The thermal fuse according to the invention is snap-fitted to an electronic component. A carrier may comprise said electronic component according to the invention. In embodiments, said carrier may be a PCB. Such an electronic component may moreover be, for example: a transistor, a capacitor, a battery, or a microprocessor. The electronic component may therefore be a component which needs temperature monitoring. In an embodiment, the electronic component is a MOSFET.

As mentioned, the holder comprises a bottom surface for mounting the holder to a carrier comprising the electronic component. In an embodiment, the holder may comprise a soldering pin for mounting the holder to the carrier. This advantageously enables the holder to be mounted and/or positioned onto the carrier which comprises the electronic component. For example, the first wall and the second wall may comprise an indentation to accommodate a soldering element, which soldering element comprises a soldering pin directed in the direction of the bottom surface, so as to be able to mount said holder via soldering. The holder may also comprise a fourth wall and a fifth wall for accommodating such a soldering element comprising a soldering pin. The soldering pins may also be comprised by the bottom surface and protrude therefrom, so as to mount the holder to the carrier.

It may moreover be relevant to orient the holder accordingly in respect to the electronic component. In an embodiment, the bottom surface may comprise at least one protrusion for aligning, on the carrier, the holder relative to the electronic component. Such at least one protrusion may be made of the same material as the holder, and may be in one piece with said holder. As a result, the holder comprises a protrusion, such as for example a pin or a guide, for aligning the holder accordingly in respect to the electronic component on the carrier.

As mentioned, the protrusion of the first wall and the protrusion of the second wall enable snap-fitting the thermal fuse to the electronic component. The concept of snap-fitting may be well known in the art. Said protrusions may e.g. comprise a triangular shape, or a teeth shape, etc. As mentioned, the thermal fuse may abut the electronic component. Such abutting contact may improve the working of the thermal fuse, as the temperature of the component may directly be measured, without tolerances affecting/interfering with the contact. Such an abutting contact may be improved by the protrusion having a stepped edge pressing down the thermal fuse, which stepped edge may cover any tolerances. Hence, in an embodiment, each of said protrusion may comprise a bottom edge facing the bottom surface, wherein said bottom edge may comprise a stepped profile. Thus, such a stepped profile may be advantageously take into account any tolerances (e.g. varying thickness of the thermal fuse (head)) when snap-fitting the thermal fuse to the electronic component.

It may also be advantageous to easily slide the thermal fuse into the snap-fit contact. Hence, in an embodiment, said protrusion comprises an upper edge facing away from the bottom surface, wherein said upper edge comprises a straight profile.

The at least one lead may be soldered to an electronic circuit on the carrier. The holder according to the invention may therefore comprise at least one hole for holding (or: guiding, or: accommodating), respectively, the at least one lead (wire). Hence, in an embodiment, said bottom surface may comprise at least one hole for inserting, respectively, the at least one lead of the thermal fuse. Moreover, to facilitate putting said at least one lead through such at least one hole, in an embodiment, said at least one hole may comprise a funnel shape. Such a design of a holder is advantageous and provide much flexibility in connecting said thermal fuse and corresponding at least one lead to the electronic component and/or to the carrier.

It is further an object of the invention to provide an improved assembly (or: system) for snap-fitting a thermal fuse to an electronic component, which at least alleviates the problems and disadvantages mentioned above. Thereto, the invention further provides an assembly for snap-fitting a thermal fuse to an electronic component, wherein the assembly comprises: the holder according to the invention; the thermal fuse; a carrier comprising the electronic component; wherein the holder is mounted to the carrier so as the opening of the bottom surface of the holder accommodates the electronic component; wherein the thermal fuse is snap-fitted to the electronic component between the first wall and the second wall; wherein the thermal fuse comprises at least one lead, wherein the at least one lead is bent around the edge of the third wall. Thereby, advantages and/or embodiments applying to the holder according to the invention may mutatis mutandis apply to said assembly according to the invention.

It is further an object of the invention to provide an improved carrier comprising the holder or the assembly according to the invention, which at least alleviates the problems and disadvantages mentioned above. Thereto, the invention further provides a carrier comprising the holder according to the invention; or comprising the assembly according to the invention. Thereby, advantages and/or embodiments applying to the holder according to the invention may mutatis mutandis apply to said carrier according to the invention. Such a carrier may e.g. be a PCB for a lighting driver.

It is further an object of the invention to provide an improved lighting device comprising the holder, or the assembly, or the carrier according to the invention, which at least alleviates the problems and disadvantages mentioned above. Thereto, the invention further provides a lighting device comprising the holder according to the invention; or comprising the assembly according to the invention; or comprising the carrier according to the invention. Thereby, advantages and/or embodiments applying to the holder according to the invention may mutatis mutandis apply to said lighting device according to the invention. Such a lighting device may for example be a spotlight, or a LED luminaire.

It is further an object of the invention to provide an improved use of the holder according to the invention, which at least alleviates the problems and disadvantages mentioned above. Thereto, the invention further provides the use of the holder according to the invention to snap-fit a thermal fuse to an electronic component. The invention may moreover provide the use of the assembly, the carrier, or the lighting device according to the invention.

It is further an object of the invention to provide an improved method of snap-fitting a thermal fuse to an electronic component, which at least alleviates the problems and disadvantages mentioned above. Thereto, the invention further provides a method of snap-fitting a thermal fuse to an electronic component with the holder according to the invention, the method comprising: mounting the holder to a carrier comprising the electronic component, wherein said opening of the bottom surface of the holder accommodates the electronic component; bending at least one lead of the thermal fuse around said edge of the third wall; snap-fitting the thermal fuse to the electronic component in the holder with the protrusion of the first wall and the protrusion of the second wall. Said snap-fitting may e.g. be performed with a dedicated tool during manufacturing, which dedicated tool may be a press for pressing the thermal fuse in the snap-fit connection of the holder, in between the first wall and the second wall.

In an embodiment, the bottom surface of the holder may comprise at least one hole, the method comprising: inserting the at least one lead of the thermal fuse, respectively, through said at least one hole.

BRIEF DESCRIPTION OF THE DRAWINGS

The invention will now be further elucidated by means of the schematic non-limiting drawings:

FIG. 1A, FIG. 1B, FIG. 1C depict schematically an embodiment of an assembly for snap-fitting a thermal fuse to an electronic component according to the invention, wherein the assembly comprises a holder according to the invention, the thermal fuse and a carrier comprising the electronic component, wherein FIG. 1A is in perspective view, 1B is a sideview, and 1C is a top view;

DETAILED DESCRIPTION OF THE EMBODIMENTS

As mentioned in the background section, a clear need exists to find an improved solution to mount a thermal fuse to an electronic component. An improved holder for snap-fitting a thermal fuse to an electronic component is therefore provided according to the invention.

Figure 1A:
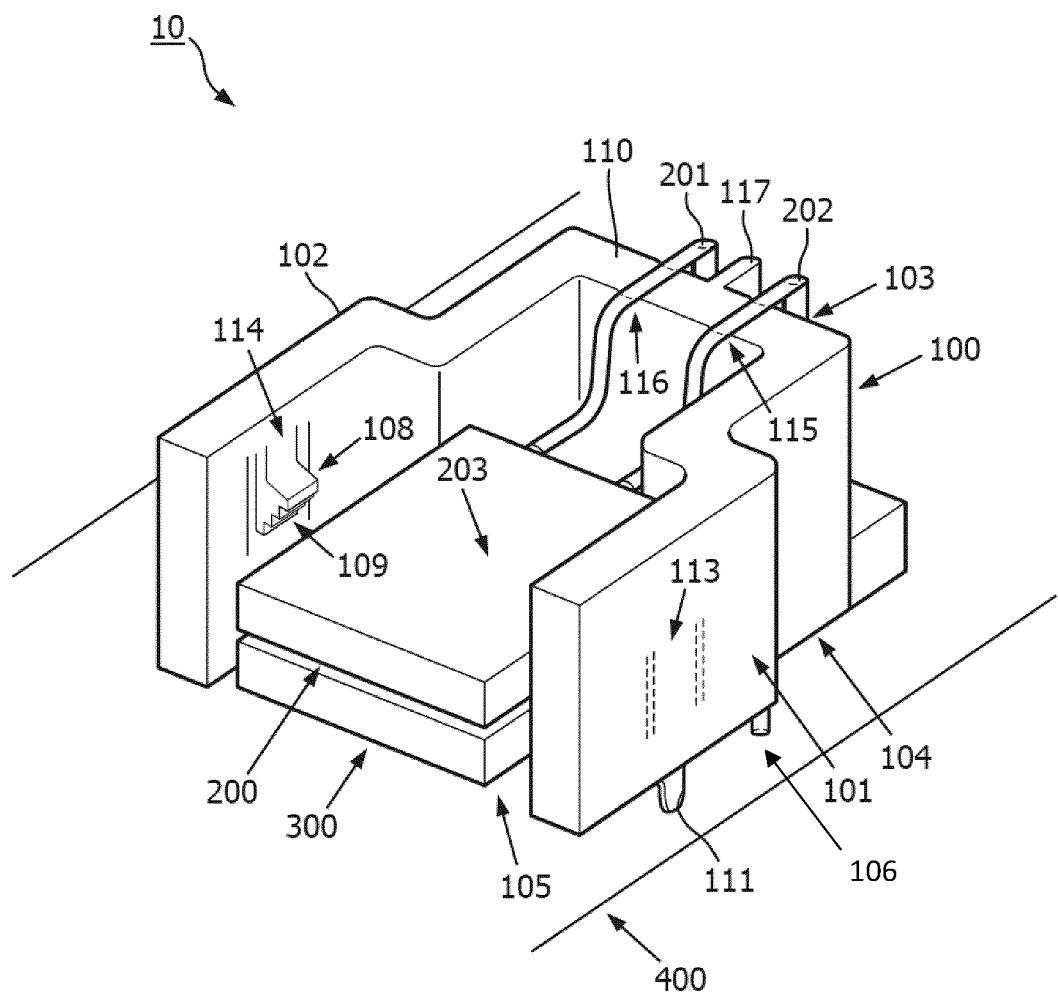
Figure 1B:
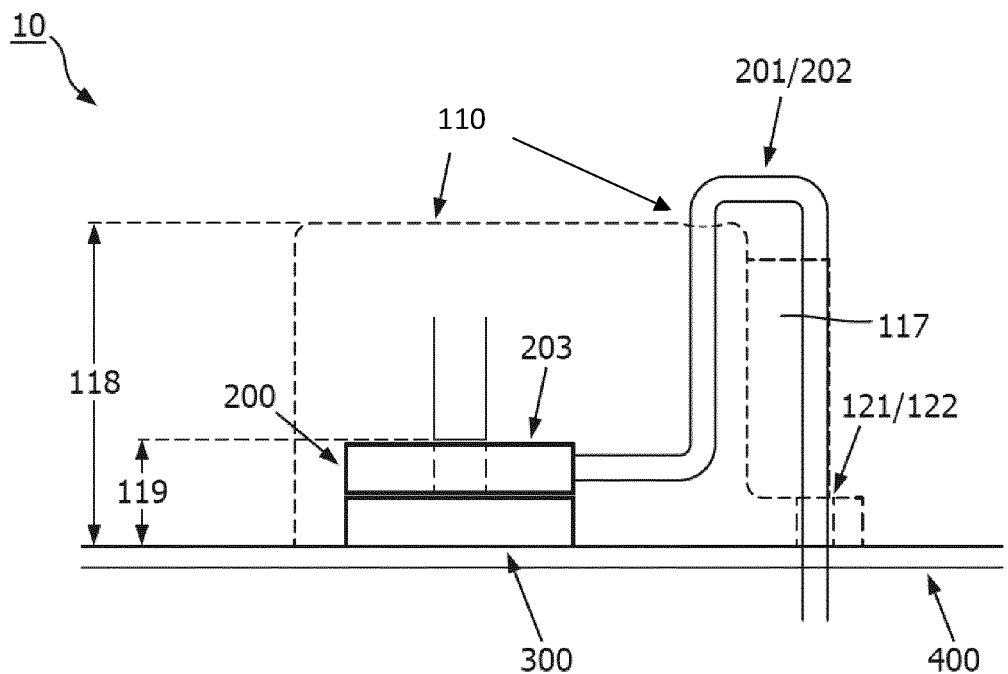
Figure 1C:
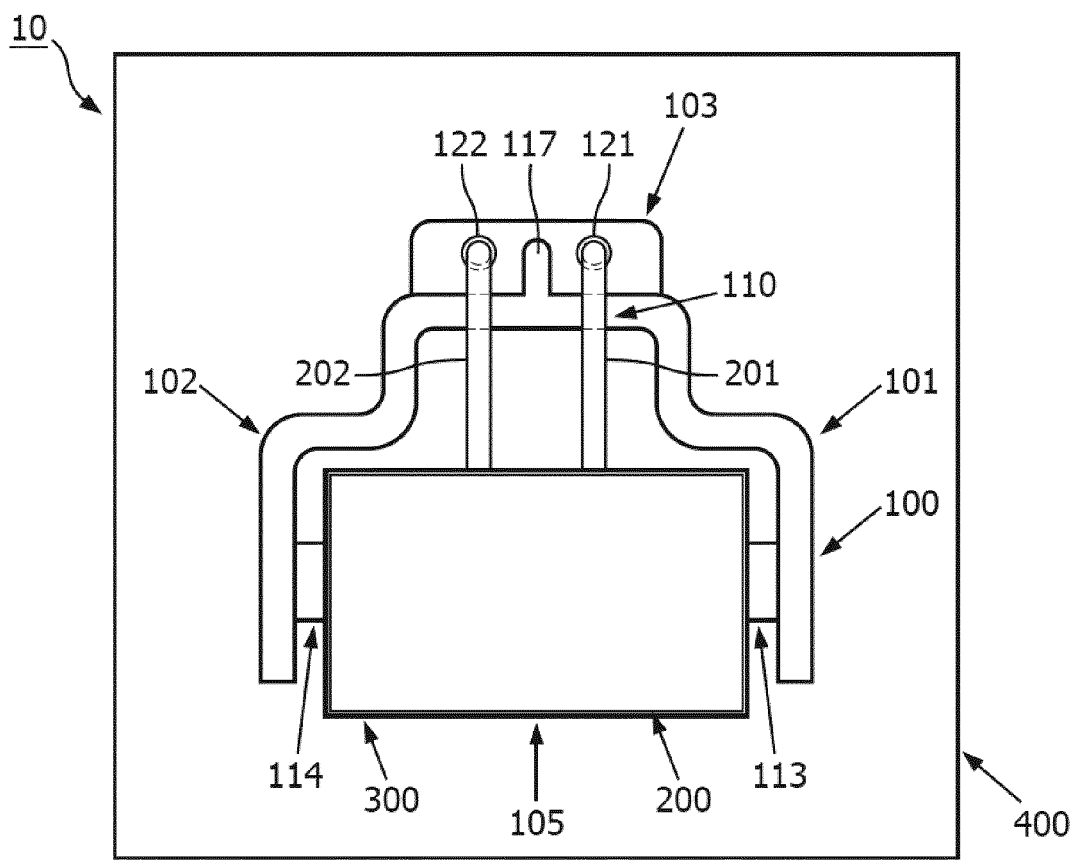

FIG. 1A-C depicts schematically, by non-limiting example, an embodiment of an assembly 10 for snap-fitting a thermal fuse 200 to an electronic component 300. The assembly comprises a carrier 400 comprising the electronic component 300, a holder 100 for snap-fitting the thermal fuse 200 to the electronic component 300, and the thermal fuse 200. The carrier 400 comprises the electronic component 300. The carrier 400 is a PCB. The electronic component 300 is part of the circuitry of the PCB. Such a circuitry may for example control a lighting device. The electronic component 300 requires temperature monitoring and temperature protection. Therefore, the thermal fuse 200 is mounted on top of the electronic component 300. Here, the electronic component 300 is a MOSFET, yet alternatively the electronic component 300 may be a transistor, a capacitor, a battery, or a microprocessor.

The thermal fuse 200 comprises a first lead wire 201, a second lead wire 202 and a head 203. The head 203 of the thermal fuse 200 abuts the surface of the electronic component 300 for said temperature protection. Said first lead wire 201 and said second lead wire 202 are also connected to the circuitry of the carrier 400 to enable said temperature protection, such temperature protection with thermal fuses is well known in the art. The first lead wire 201 and the second lead wire 202 are soldered to the carrier 400 so as to be part of said circuitry. As the first lead wire 201 and the second lead wire 202 are soldered to the PCB, the first lead wire 201 and the second lead wire 202 are sufficiently long to prevent erroneous triggering of the head 203 of the thermal fuse 200 due to heat transfer originating from the soldering process.

The holder 100 according to the invention comprises a bottom surface 104. The bottom surface 104 of the holder 100 is mounted to the carrier 400. Here, the holder 100 comprises two respective soldering pins 111, (second not visible in perspective hence not depicted) for mounting the holder 100 to the carrier 400. Such features are optional. Alternatively, the holder 100 may be mounted to the carrier by means of other fastening means, such as clicking; gluing; mechanical fastening such as a nut, pin, bolt, nail, rivet, etc.; magnetic fastening means; clamping, snap-fitting; overlap-inserting or using an insert mold; etc.

The holder 100 according to the invention is made of a holder material comprising a polymer material. The polymer material may be ABS. Alternatively, said polymer material may be one of: PP, PE, PA, PC, PBT, PS, PVC, PF, HDPE, LDPE, or PTFE. Yet alternatively, said holder material may comprise a metal or a ceramic, for example several parts of the holder may be made of a metal, such as copper alignment pins or tin soldering pins.

Still referring to FIG. 1A-C, the bottom surface 104 comprises an opening 105. The opening 105 may also be an aperture. The electronic component 300 is accommodated within said opening 105; i.e. when the holder 100 is mounted onto the carrier 400 so as to snap-fit the thermal fuse 200 onto the electronic component 300 accordingly. Here, the bottom surface 104 fully surrounds said opening 105, but alternatively the bottom surface may at least partly surround said opening.

In order to align, on the carrier 400, the holder 100 relative to the electronic component 300, the bottom surface 104 of the holder 100 further comprises two protrusions 106, (other not visible in perspective hence not depicted). Said protrusions 106 have a pin shape, which fit into corresponding holes (not depicted) of the carrier 400, which allows for aligning the holder 100 with respect to the electronic component 300. Such features are optional. Alternatively, at least one protrusion may be used for such alignment, or a shaped protrusion, such as a guide; thereby noting the presence of corresponding holes and/or grooves.

Thus, as mentioned, the bottom surface 104 comprises an opening 105 for accommodating the electronic component 300. The bottom surface 104 further comprises a first wall 101, a second wall 102 and a third wall 103. Here, the first wall 101, the second wall 102, and the third wall 103 is perpendicular to the bottom surface 104. Namely, said walls 101, 102, 103 protrude from said bottom surface 104. Here, the first wall 101 is parallel to the second wall 102. Here, the third wall 103 is transverse to the first wall 101 and the second wall 102, and connects the first wall 101 to the second wall 102. However, such a configuration of walls is not essential, since other configurations of the present invention may envision other designs, as defined by the independent claims. The walls may for example be 'double walled' walls.

The first wall 101 and the second wall 102 each comprise a protrusion 113, 114 for snap-fitting the thermal fuse 200 to the electronic component 300. The concept of snap-fitting may be well known in the art. Thereby, the thermal fuse 200 abuts the electronic component 300. Said protrusions 113, 114 on the first wall 101 and the second wall 102 comprise an upper edge 108 facing away from the bottom surface 104, and a bottom edge 109 facing towards the bottom surface 104. Here, the protrusions 113, 114 are triangular of shape, but may alternatively any other geometric shape suitable for serving as a protrusion for snap-fitting one component to another component. Said protrusions 113, 114 are depicted in FIG. 1 just above the thermal fuse head 203 for convenience in order to depict all of their detail; whereas according to the invention the protrusions 113, 114 snap-fit and thereby hold the thermal fuse firmly to the electronic component 300.

Here, the upper edge 108 of the respective protrusion 113, 114 comprises a straight profile, such as a smooth linear line, which allows for easily sliding the thermal fuse 200 into the snap-fit connection established by the protrusions 113, 114 on respectively the first wall 101 and the second wall 102. Here, the bottom edge 109 of the respective protrusion 113, 114 comprises a stepped profile. Due to said stepped profile, any tolerance (such as varying thickness of the head 203 of the thermal fuse 200) is advantageously taken into account. For example, a thinner thermal fuse head may be held in an abutting position to the electronic component by the steps downstream of the bottom edge, while a thicker thermal fuse head may be held in an abutting position to the electronic component by the steps upstream of the bottom edge. Hence allowing different kind of thermal fuses to be used with the present holder.

All in all, considering the above and still referring to FIG. 1, the holder 100 advantageously enables the electronic component 300 to be in a position in which the electronic component 300 may be mutually aligned with the thermal fuse 200 which is snap-fitted into the holder 100 and onto said electronic component 300. Thereby, the thermal fuse 200 abuts the electronic component 300.

Still referring to FIG. 1A-C, particularly FIG. 1B, the third wall 103 comprises an edge 110. The edge 110 is configured to bend around the first lead wire 201 and the second lead wire 202 of the thermal fuse 200. Said bending may e.g. be done during assembly, wherein the thermal fuse 200 is pressed with a dedicated pressing tool into the holder 100 for snap-fitting the thermal fuse 200 to the electronic component 300. The edge 110 is geometrically above the respective protrusion 113, 114 of the first wall 101 and the second wall 102, e.g. when considering the bottom surface 104 as a bottom plane of a coordinate system having an origin of axis at the bottom surface 104. In other words, the shortest distance 118 between the bottom surface 104 and said edge 110 is larger than a shortest distance 119 between the bottom surface 104 and one of said protrusion 113, 114. The shortest distance 119 between the bottom surface 104 and one of said protrusion 113, 114 may for example be the shortest (e.g. perpendicular) distance between the bottom surface 104 and the intersection of the bottom edge 109 and the upper edge 108 of the respective protrusion 113, 114 (i.e. e.g. the tip of the triangular shape of the protrusion).

Furthermore, said edge 110 comprises a first recess 115 and a second recess 116. The first recess 115 and the second recess 116 are arranged for accommodating said bending of the first lead wire 201 and the second lead wire 202 around said edge 110. Moreover, to prevent the first lead wire 201 from touching the second lead wire 202, the third wall 103 comprises a ridge 117, wherein the first lead wire 201 is present at one side of the ridge 117 and the second lead wire 202 is present at the other side of the ridge 117. Alternatively, or additionally, said third wall may comprise a groove for accommodating said lead wires and isolating them from each other. Yet alternatively, said third wall may comprise a hole through which the lead wires are put, such that the material of the holder is isolating each lead wire as such.

Since the third wall 103 of the holder 100 comprises the edge 110 arranged for bending around the first lead wire 201 and the second lead wire 202 of the thermal fuse 200, wherein the shortest distance 118 between the bottom surface 104 and said edge 110 is larger than a shortest distance 119 between the bottom surface 104 and one of said protrusion 106, 107, the lead wires 201, 202 of the thermal fuse 200 may be compactly assembled with said holder 100; i.e. by means of bending the lead wires 201, 202 upwards towards the edge 110 of the third wall 103 and around said edge 110 of the third wall 103 downwards towards the carrier 400 to which the lead wires 201, 202 are soldered. The bend is execrated for convenience in FIG. 1B. Hence, the meandering bend of the lead wires 201, 202 in the direction perpendicular to the bottom surface and perpendicular to the carrier 400 provides more compactness and more space on the carrier 400, because said relatively long thermal fuse lead wires 201, 202 are accommodated in the height dimension and not in the plane of the carrier 400. Hence, the holder 100 according to the invention also provides efficient built-up of the PCB.

Thus, the first lead wire 201 and the second lead wire 202 of the thermal fuse 200 can be soldered close to the location on the carrier 400 where said electronic component 300 and the thermal fuse 200 mounted thereon are present, while said soldering (close by) does not render a false trigger. This is a clear advantage, and moreover a benefit provided by said holder 100.

Moreover, the holder 100 comprises a first hole 121 and a second hole 122 in the bottom surface 104. The first lead wire 201 is inserted through said first hole 121 and through a corresponding hole in the carrier 400 so as to solder the first lead wire 201 to the resulting opposite surface of the carrier 400. The second lead wire 202 is inserted through said second hole 122 and through a corresponding hole in the carrier 400 so as to solder the second lead wire 202 to the resulting opposite surface of the carrier 400. Here, the first hole 121 and the second hole 122 comprises a funnel shape. This funnel shape allows for the lead wires to be more ergonomically put through said holes.

Figure 2:
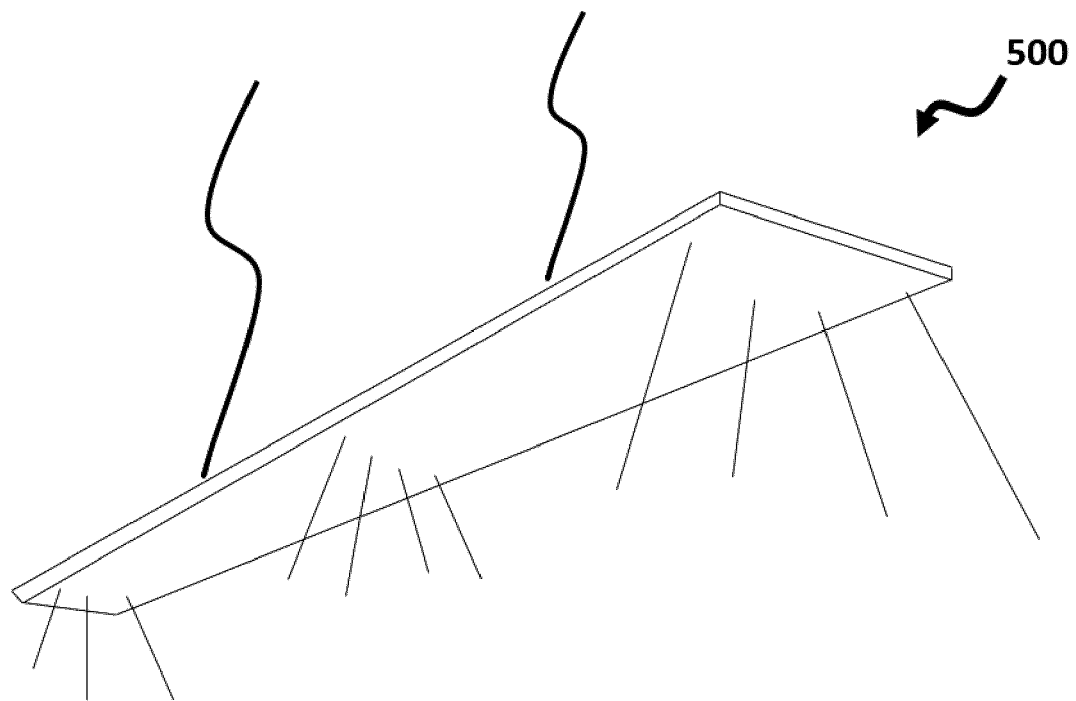
FIG. 2 depicts schematically a lighting device according to the invention comprising the assembly according to the invention.

FIG. 2 depicts schematically a lighting device 500 according to the invention comprising the assembly 10 according to the embodiment depicted in FIG. 1.

Figure 3:
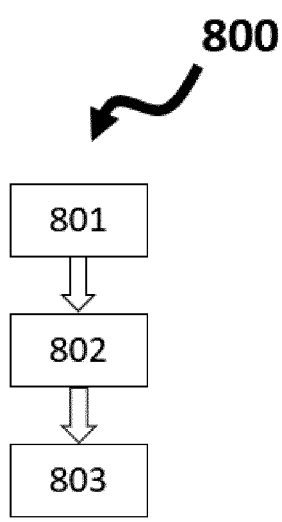
FIG. 3 depicts schematically an embodiment of a method according to the invention.

FIG. 3 depicts schematically, by non-limiting example, a method 800 a method snap-fitting a thermal fuse to an electronic component with the holder according to the invention. The holder comprises the bottom surface, the first wall, the second wall, and the third wall as indicated above. Thereby, a carrier comprises the electronic component, whereby the electronic component is a MOSFET and the carrier a PCB. Alternatively, other configurations of carriers may be envisioned, with different electronic components requiring thermal monitoring and/or protection. The method comprises step 801 of mounting the holder to the carrier comprising the electronic component. The opening of the bottom surface of the holder accommodates the electronic component. Alternatively, or additionally, the method may comprise aligning, on the carrier, the holder relative to said electronic component. The method further comprises step 802 of bending at least one lead (e.g. a first lead wire and a second lead wire of a thermal fuse) of the thermal fuse around said edge of the third wall of the holder. Further, the method comprises step 803 of snap-fitting the thermal fuse to the electronic component in the holder with the protrusion of the first wall and the protrusion of the second wall.

The invention claimed is:

1. A holder for snap-fitting a thermal fuse to an electronic component, wherein the holder comprises:
   a bottom surface for mounting the holder to a carrier comprising the electronic component, wherein the bottom surface comprises an opening for accommodating the electronic component;
   a first wall parallel to a second wall, wherein the first wall and the second wall each comprise a protrusion for snap-fitting the thermal fuse to the electronic component;
   a third wall, wherein the third wall comprises an edge for bending around at least one lead of the thermal fuse, wherein a shortest distance between the bottom surface and said edge is larger than a shortest distance between the bottom surface and one of said protrusion.

2. The holder according to claim 1, wherein the first wall, the second wall and the third wall are perpendicular to the bottom surface and/or protrude from the bottom surface.

3. The holder according claim 1, wherein said edge comprises at least one recess for bending around, respectively, the at least one lead of the thermal fuse.

4. The holder according to claim 1, wherein the third wall comprises a ridge for isolating a first lead of the at least one lead of the thermal fuse from a second lead of the at least one lead of the thermal fuse.

5. The holder according to claim 1, wherein the holder comprises a polymer material.

6. The holder according to claim 1, wherein the electronic component is a MOSFET.

7. The holder according to claim 1, wherein the holder comprises a soldering pin for mounting the holder to the carrier.

8. The holder according to claim 1, wherein each of said protrusion comprises a bottom edge facing the bottom surface, wherein said bottom edge comprises a stepped profile.

9. The holder according to claim 1, wherein said bottom surface comprises at least one hole for inserting, respectively, the at least one lead of the thermal fuse.

10. The holder according to claim 9, wherein said at least one hole comprises a funnel shape.

11. The holder according to claim 1, wherein the bottom surface comprises at least one protrusion for aligning, on the carrier, the holder relative to the electronic component.

12. An assembly for snap-fitting a thermal fuse to an electronic component, wherein the assembly comprises:
   the holder according to claim 1;
   the thermal fuse;
   the carrier comprising the electronic component;
   wherein the holder is mounted to the carrier so as the opening of the bottom surface of the holder accommodates the electronic component;
   wherein the thermal fuse is snap-fitted to the electronic component between the first wall and the second wall;
   wherein the thermal fuse comprises the at least one lead, wherein the at least one lead is bent around the edge of the third wall.

13. The carrier comprising the holder according to claim 1.

14. A lighting device comprising the holder according to claim 1.

* * * * *